(12) United States Patent
Zhang (10) Patent No.: US 8,332,199 B1
(45) Date of Patent: Dec. 11, 2012

(54) GRAPHICAL USER INTERFACE FOR VIEWING INTERMEDIATE CALCULATIONS FROM A DEVICE MODEL

(75) Inventor: Xisheng Zhang, Sunnyvale, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 627 days.

(21) Appl. No.: 12/276,305

(22) Filed: Nov. 22, 2008

Related U.S. Application Data (63) Continuation-in-part of application No. 12/123,407, filed on May 19, 2008, now abandoned.

(60) Provisional application No. 60/938,767, filed on May 18, 2007.

(51) Int. Cl.
  *G06F 17/50* (2006.01)
(52) U.S. Cl. .......................... 703/14; 703/13
(58) Field of Classification Search .............. 703/14; 716/136
  See application file for complete search history.

(56) References Cited

U.S. PATENT DOCUMENTS

| | | | | |
|---|---|---|---|---|
| 5,867,399 | A * | 2/1999 | Rostoker et al. | 716/102 |
| 6,128,768 | A * | 10/2000 | Ho | 716/115 |
| 6,236,956 | B1 * | 5/2001 | Mantooth et al. | 703/14 |
| 6,530,065 | B1 * | 3/2003 | McDonald et al. | 716/102 |
| 6,832,182 | B1 * | 12/2004 | Wilson, Jr. | 703/13 |
| 6,941,258 | B2 * | 9/2005 | Van Heijningen et al. | 703/16 |
| 7,415,403 | B2 * | 8/2008 | McGaughy | 703/14 |
| 2003/0006986 | A1 * | 1/2003 | Dick et al. | 345/440 |

* cited by examiner

*Primary Examiner* — Eunhee Kim (57) ABSTRACT

In an example embodiment, the system receives user inputs including: (1) a netlist that describes the circuit elements and connections of an integrated circuit; (2) a mathematical device model that corresponds to the integrated circuit and that includes an equation with a number of parameters and decision variables grouped into terms; and (3) a description of an input voltage. Based on these inputs, the system calculates an output such as a voltage or current. The system displays a GUI that includes a view which shows each of the terms of the equation after a value has been assigned to each parameter and to each decision variable and a view which shows each of the terms of the equation after reduction of the values assigned to each parameter and each decision variable. Upon receipt of a user's change to the value of a parameter, the system promptly updates the views.

20 Claims, 12 Drawing Sheets

$$V_{th} = V_{th0ox} + K_{1ox} \cdot \sqrt{\Phi_s - V_{bseff}} - K_{2ox} V_{bseff}$$

$$+ K_{1ox}\left(\sqrt{1 + \frac{Nlx}{L_{eff}}} - 1\right)\sqrt{\Phi_s} + (K_3 + K_{3b}V_{bseff}) \frac{T_{ox}}{W_{eff}' + W_\sigma}\Phi_s$$

$$- D_{VT0w}\left(\exp\left(-D_{VT1w}\frac{W_{eff}'L_{eff}}{2l_{tw}}\right) + 2\exp\left(-D_{VT1w}\frac{W_{eff}'L_{eff}}{l_{tw}}\right)\right)(V_{bt} - \Phi_s)$$

$$- D_{VT0}\left(\exp\left(-D_{VT1}\frac{L_{eff}}{2l_t}\right) + 2\exp\left(-D_{VT1}\frac{L_{eff}}{l_t}\right)\right)(V_{bi} - \Phi_s)$$

$$- \left(\exp\left(-D_{sub}\frac{L_{eff}}{2l_{t\sigma}}\right) + 2\exp\left(-D_{sub}\frac{L_{eff}}{l_{t\sigma}}\right)\right)(E_{ta\sigma} + E_{tab}V_{bseff})V_{ds}$$

$$V_{th0ox} = V_{th0} - K_1 \cdot \sqrt{\Phi_s}$$

$$K_{1ox} = K_1 \cdot \frac{T_{ox}}{T_{oxm}}$$

$$K_{2ox} = K_2 \cdot \frac{T_{ox}}{T_{oxm}}$$

FIG. 1

| SYMBOLS USED IN EQUATION | SYMBOLS USED IN SPICE | DESCRIPTION | DEFAULT | UNIT | NOTE |
|---|---|---|---|---|---|
| $V_{th0}$ | vth0 | THRESHOLD VOLTAGE @ Vbs=0 FOR LARGE L. | 0.7 (NMOS) -0.7 (PMOS) | V | nl-1 |
| VFB | vfb | FLAT-BAND VOLTAGE | CALCULATED | V | nl-1 |
| K1 | k1 | FIRST ORDER BODY EFFECT COEFFICIENT | 0.5 | $V^{1/2}$ | nl-2 |
| K2 | k2 | SECOND ORDER BODY EFFECT COEFFICIENT | 0.0 | NONE | nl-2 |
| K3 | k3 | NARROW WIDTH COEFFICIENT | 80.0 | NONE | |
| K3b | k3b | BODY EFFECT COEFFICIENT OF k3 | 0.0 | 1/V | |
| W0 | w0 | NARROW WIDTH PARAMETER | 2.5e-6 | m | |
| N1x | n1x | LATERAL NON-UNIFORM DOPING PARAMETER | 1.74e-7 | m | |
| Vbm | vbm | MAXIMUM APPLIED BODY BIAS IN Vth CALCULATION | -3.0 | V | |
| Dvt0 | dvt0 | FIRST COEFFICIENT OF SHORT-CHANNEL EFFECT ON Vth | 2.2 | NONE | |
| Dvt1 | dvt1 | SECOND COEFFICIENT OF SHORT-CHANNEL EFFECT ON Vth | 0.53 | NONE | |
| Dvt2 | dvt2 | BODY-BIAS COEFFICIENT OF SHORT-CHANNEL EFFECT ON Vth | -0.032 | 1/V | |
| Dvt0w | dvt0w | FIRST COEFFICIENT OF NARROW WIDTH EFFECT ON Vth FOR SMALL CHANNEL LENGTH | 0 | 1/m | |
| Dvt1w | dvt1w | SECOND COEFFICIENT OF NARROW WIDTH EFFECT ON Vth FOR SMALL CHANNEL LENGTH | 5.3e6 | 1/m | |

FIG. 2A

| SYMBOLS USED IN EQUATION | SYMBOLS USED IN SPICE | DESCRIPTION | DEFAULT | UNIT | NOTE |
|---|---|---|---|---|---|
| Dvt2w | dvt2w | BODY-BIAS COEFFICIENT OF NARROW WIDTH EFFECT FOR SMALL CHANNEL LENGTH | -0.032 | 1/V | |
| $\mu 0$ | u0 | MOBILITY AT TEMP = Tnom<br>NMOSFET<br>PMOSFET | 670.0<br>250.0 | $cm^2/Vs$ | |
| Ua | ua | FIRST-ORDER MOBILITY DEGRADATION COEFFICIENT | 2.25E-9 | m/V | |
| Ub | ub | SECOND-ORDER MOBILITY DEGRADATION COEFFICIENT | 5.87E-19 | $(m/V)^2$ | |
| Uc | uc | BODY-EFFECT OF MOBILITY DEGRADATION COEFFICIENT | mobMod = 1, 2:<br>-4.65e-11<br>mobMod = 3:<br>-0.046 | $m/V^2$<br><br><br><br>1/V | |
| vsat | vsat | SATURATION VELOCITY AT TEMP = Tnom | 8.0E4 | m/SEC | |
| A0 | a0 | BULK CHARGE EFFECT COEFFICIENT FOR CHANNEL LENGTH | 1.0 | NONE | |
| Ags | ags | GATE BIAS COEFFICIENT OF ABULK | 0.0 | 1/V | |
| B0 | b0 | BULK CHARGE EFFECT COEFFICIENT FOR CHANNEL WIDTH | 0.0 | m | |
| B1 | b1 | BULK CHARGE EFFECT WIDTH OFFSET | 0.0 | m | |
| Keta | keta | BODY-BIAS COEFFICIENT OF BULK CHARGE EFFECT | -0.047 | 1/V | |
| A1 | a1 | FIRST NON-SATURATION EFFECT PARAMETER | 0.0 | 1/V | |
| A2 | a2 | SECOND NON-SATURATION FACTOR | 1.0 | NONE | |

FIG. 2B

| SYMBOLS USED IN EQUATION | SYMBOLS USED IN SPICE | DESCRIPTION | DEFAULT | UNIT | NOTE |
|---|---|---|---|---|---|
| Rdsw | rdsw | PARASITIC RESISTANCE PER UNIT WIDTH | 0.0 | $\Omega\text{-}\mu m W r$ | |
| Prwb | prwb | BODY EFFECT COEFFICIENT OF Rdsw | 0 | $V^{-1/2}$ | |
| Prwg | prwg | GATE BIAS EFFECT COEFFICIENT OF Rdsw | 0 | $1/V$ | |
| Wr | wr | WIDTH OFFSET FROM Weff FOR Rds CALCULATION | 1.0 | NONE | |
| Wint | wint | WIDTH OFFSET FITTING PARAMETER FROM 1-V WITHOUT BIAS | 0.0 | m | |
| Lint | lint | LENGTH OFFSET FITTING PARAMETER FROM 1-V WITHOUT BIAS | 0.0 | m | |
| dWg | dwg | COEFFICIENT OF Weff's GATE DEPENDENCE | 0.0 | m/V | |
| dWb | dwb | COEFFICIENT OF Weff's SUBSTRATE BODY BIAS DEPENDENCE | 0.0 | $m/V^{1/2}$ | |
| Voff | voff | OFFSET VOLTAGE IN THE SUBTHRESHOLD REGION AT LARGE W AND L | -0.08 | V | |
| Nfactor | nfactor | SUBTHRESHOLD SWING FACTOR | 1.0 | NONE | |
| Eta0 | eta0 | DIBL COEFFICIENT IN SUBTHRESHOLD REGION | 0.08 | NONE | |
| Etab | etab | BODY-BIAS COEFFICIENT FOR THE SUBTHRESHOLD DIBL EFFECT | -0.07 | $1/V$ | |
| Dsub | dsub | DIBL COEFFICIENT EXPONENT IN SUBTHRESHOLD REGION | DROUT | NONE | |
| Cit | cit | INTERFACE TRAP CAPACITANCE | 0.0 | $F/m^2$ | |
| Cdsc | cdsc | DRAIN/SOURCE TO CHANNEL COUPLING CAPACITANCE | 2.4E-4 | $F/m^2$ | |

FIG. 2C

```
.MODEL NMOS NMOS
*** FLAG PARAMETER ***
+level = 49          version = 3.2        binunit = 2
+mobmod = 1          capmod= 3              nqsmod = 0
*** Vth RELATED PARAMETER ***
+vth0 = 0.7          k1 = 0.385           k2 = -0.027
+k3 = -0.184         k3b = 0.331          w0 = 2.5E-6
+n1x = 1.459E-7      dvt0 = 14.584        dvt1 = 2.069
+dvt2 = -0.032       dvt0w = 0            dvt1w = 5.3E6
+dvt2w = -0.032      ngate = 1E30
*** MOBILITY RELATED PARAMETER ***
+u0 = 0.067          ua = 2.25E-9         ub = 5.87E-19
+uc = -4.65E-11      vsat = 8E4           a0 = 1
+ags = 0             b0 = 0               b1 = 0
+keta = 0            a1 = 0               a2 = 1
+rdsw = 0            prwb = 0             prwg = 0
+wr = 1
*** SUBTHRESHOLD RELATED PARAMETER ***
+voff = -0.08        nfactor = 1          eta0 = 0.08
+etab = -0.07        dsub = 0.56          cit = 0
+cdsc = 2.4E-4       cdscb = 0            cdscd = 0
*** OUTPUT RESISTANCE RELATED PARAMETER ***
+pclm = 1.3          pdiblc1 = 0.39       pdiblc2 = 8.6E-3
+pdiblcb = 0         drout= 0.56          pscbe1 = 4.24E8
+pscbe2 = 1E-5       pvag = 0             delta = 0.01
+alpha0 = 0          beta0 = 0
*** DIODE PARAMETER ***
+acm = 12            ldif = 0             hdif = 0
+rsh = 0             rd = 0               rs = 0
+rsc = 0             rdc = 0              cj = 5E-4
+mj = 0.5            mjsw = 0.33          cjsw = 5E-10
+cjswg = 5E-10       mjswg = 0.33         js = 1E-4
+jsw = 0             n = 1                pbsw = 1
+pb = 1              pbswg = 1
*** CAPACITANCE PARAMETER ***
+xpart = 0           cgso = 0             cgdo = 0
+cgbo = 0            ckappa = 0.6         cf= 0
+clc = 1E-7          cle = 0.6            dlc = 0
+dwc = 0             vfbcv = -1           cgs1 = 0
+cgd1 = 0
*** STRESS EFFECT RELATED PARAMETER ***
+saref = 1E-6        sbref = 1E-6         wlod = 0
+ku0 = 0             kvsat = 0            kvth0 = 0
+tku0 = 0            llodku0 = 0          wlodku0 = 0
+llodvth = 0         wlodvth = 0          lku0 = 0
+wku0 = 0            pku0 = 0             lkvth0 = 0
+wkvth0 = 0          pkvth = 0            stk2 = 0
+lodk2 = 1           steta0 = 0           lodeta0 = 1
*** TEMPERATURE COEFFICIENT ***
+tnom = 25           ute = -1.5           kt1 = -0.11
+kt11 = 0            kt2 = 0.022          ua1 = 4.31E-9
+ub1 = -7.61E-18     uc1 = -5.6E-11       at = 3.3E4
+prt = 0             xti = 3
```

FIG. 3

Selected Points(BSIM3V3) Info:

P1 W = 0.204; L = 0.452; T = 25; Vbs = 0; Vds = 0.1; Vgs = 1.6;

Threshold voltage $$V_{th} = V_{th0\sigma x} \cdot K_{1\sigma x} \cdot \sqrt{\Phi_s - V_{bseff}} \cdot K_{2\sigma x} V_{bseff}$$
$$+ K_{1\sigma x} \left( \sqrt{1 + \frac{Nlx}{L_{eff}}} - 1 \right) \sqrt{\Phi_s} + (K_3 + K_{3b} V_{bseff}) \frac{T_{ox}}{W'_{eff} + W_\sigma} \Phi_s$$
$$- D_{VT\sigma w} \left( \exp\left(-D_{VT1w} \frac{W'_{eff} L_{eff}}{2 l_{tw}}\right) + 2\exp\left(-D_{VT1w} \frac{W'_{eff} L_{eff}}{l_{tw}}\right) \right) (V_{bi} - \Phi_s)$$
$$- D_{vt\sigma} \left( \exp\left(-D_{VT1} \frac{L_{eff}}{2 l_t}\right) + 2\exp\left(-D_{VT1} \frac{L_{eff}}{l_t}\right) \right) (V_{bi} - \Phi_s)$$
$$\left( \exp\left(-D_{sub} \frac{L_{eff}}{2 l_{t\sigma}}\right) + 2\exp\left(-D_{sub} \frac{L_{eff}}{l_{t\sigma}}\right) \right) (E_{ta\sigma} + E_{tab} V_{bseff}) V_{ds}$$

P1
$0.415 = (-4.4E-3) + 0.385 \times \sqrt{0.865 - (-9.145E-5)} - (-0.027) \times (-9.145E-5)$
$+0.385 \times \left( \sqrt{1 + \frac{1.459E-7}{3.724E-7}} - 1 \right) \times \sqrt{0.865 + ((-0.148) + 0.331 \times (-9.145E-5))} \times \frac{4.19E-9}{1.908E-7 + 0} \times 0.865$
$-0 \times \left( \exp\left(-2.807E8 \times \frac{1.906E-7 \times 3.724E-7}{2 \times 2.896E-8}\right) + 2 \times \exp\left(-2.807E6 \times \frac{1.906E-7 \times 3.724E-7}{2.896E-8}\right) \right) \times (1.019 - 0.865)$
$-14.548 \times \left( \exp\left(-2.069 \times \frac{3.724E-7}{2 \times 2.896E-8}\right) + 2 \times \exp\left(-2.069 \times \frac{3.724E-7}{2.896E-8}\right) \right) (1.019 - 0.865)$
$- \left( \exp\left(-0.615 \times \frac{3.724E-7}{2 \times 2.896E-8}\right) + 2 \times \exp\left(-0.615 \times \frac{3.724E-7}{2.896E-8}\right) \right) (0.063 + (-0.046) \times (-9.145E-5)) \times 0.1$ P1
$0.415 = (-4.4E-3) + 0.358 - 2.443E-6$
$+0.064 + (-2.807E-3)$
$-0 \times (0.032 + 2.058E-3) \times 0.154$
$-14.548 \times (1.67E-6 + 5.577E-12) \times 0.154$
$- (0.019 + 7.368E-4) \times 6.335E-3$

FIG. 4

Selected Points(BSIM3V3) Info:
P1 W = 0.214; L = 11.452; T = 25; Vhs = 11; Vris = 11; Vgs = 11.7;
P2 W = 0.214; L = 11.452; T = 25; Vhs = 11; Vris = 11; Vgs = 1.7;

Threshold voltage

$$V_{th} = V_{th0ox} - K_{1ox} \cdot \sqrt{\Phi_s - V_{bseff}} - K_{2ox} V_{bceff}$$
$$+ K_{tox} \left( \sqrt{1 + \frac{Nlx}{L_{eff}}} - 1 \right) \sqrt{\Phi_s} + (K_3 + K_{3b} V_{bseff}) \frac{T_{\sigma\pi}}{W'_{eff} + W_\sigma} \Phi_s$$
$$- D_{VT0w} \left( \exp\left(-D_{VT1w} \frac{W'_{eff} L_{eff}}{2 l_{tw}}\right) + 2\exp\left(-D_{VT1w} \frac{W'_{eff} L_{eff}}{1_{tw}}\right) \right)(V_{bi} - \Phi_s)$$
$$- D_{VT0} \left( \exp\left(-D_{VT1} \frac{L_{eff}}{2 l_t}\right) + 2\exp\left(-D_{VT1} \frac{L_{eff}}{1_t}\right) \right)(V_{bi} - \Phi_s)$$

P1

$0.415 = (-4.4E-3) + 0.385 \times \sqrt{0.865 - (-2.193E-5)} - (-0.027) \times (-9.145E-5)$
$+ 0.305 \times \left(\sqrt{1 + \frac{1.459E-7}{3.724E-7}} - 1\right) \times \sqrt{0.865 + ((-0.140) + 0.331 \times (-2.193E-5))} \times \frac{4.19E-9}{1.808E-7 + 0} \times 0.065$
$-0 \times \left(\exp\left(-2.807E0 \times \frac{1.906E-7 \times 3.724E-7}{2 \times 2.896E-8}\right) + 2 \times \exp\left(-2.807E6 \times \frac{1.906E-7 \times 3.724E-7}{2.896E-8}\right)\right) \times (1.019 - 0.865)$
$-14.518 \times \left(\exp\left(-2.069 \times \frac{3.724E-7}{2 \times 2.896E-8}\right) + 2 \times \exp\left(-2.069 \times \frac{3.724E-7}{2.896E-8}\right)\right)(1.019 - 0.865)$

P1

$0.415 = (-4.4E-3) + 0.358 - 5.857E-7$
$+0.064 + (-2.007E-3)$
$-0 \times (0.032 + 2.057E-3) \times 0.154$
$-14.548 \times (1.869E-6 + 5.571E-12) \times 0.154$
$- (0.019 + 7.360E-4) \times 6.344E-3$

P2

$0.415 = (-4.4E-3) + 0.305 \times \sqrt{0.865 - (-0.74E-5)} - (-0.027) \times (-9.74E-5)$
$+0.386 \times \left(\sqrt{1 + \frac{1.459E-7}{3.724E-7}} - 1\right) \times \sqrt{0.065 + ((-0.148) + 0.331 \times (-9.74E-6))} \times \frac{4.19E-9}{1.908E-7 + 0} \times 0.865$
$-0 \times \left(\exp\left(-2.807E6 \times \frac{1.906E-7 \times 3.721E-7}{2 \times 2.896E-8}\right) + 2 \times \exp\left(-2.807E6 \times \frac{1.906E-7 \times 3.724E-7}{2.896E-8}\right)\right) \times (1.019 - 0.865)$
$-14.548 \times \left(\exp\left(-2.068 \times \frac{3.724E-7}{2 \times 2.696E-8}\right) + 2 \times \exp\left(-2.069 \times \frac{3.724E-7}{2.996E-8}\right)\right)(1.019 - 0.865)$

P2

$0.415 = (-4.4E-3) + 0.358 - 2.602E-6$
$+0.064 + (-2.807E-3)$
$-0 \times (0.032 + 2.050E-3) \times 0.154$
$-14.648 \times (1.67E-6 + 5.577E-12) \times 0.154$
$(0.019 + 7.308E-4) \times 6.335E-3$

FIG. 5

Selected Points(BSIM3V3) Info:
P1  W = 0.204; L = 0.452; T = 25; Vhs = 0; Vds = 0.1; Vgs = 0.7;
P2  W = 0.204; L = 0.452; T = 25; Vhs = 0; Vds = 0.1; Vgs = 1.7;

Threshold voltage 601

$$V_{th} = V_{th0ox} \cdot K_{1ox} \cdot \sqrt{\Phi_s - V_{bseff}} \cdot K_{2ox} V_{bseff}$$

$$+ K_{1ox} \left( \sqrt{1 + \frac{Nlx}{L_{eff}}} - 1 \right) \sqrt{\Phi_s} + (K_3 + K_{3b} V_{bseff}) \frac{T_{ox}}{W_{eff} + W_\sigma} \Phi_s$$

$$- D_{VT0w} \left( \exp\left(-D_{VT1w} \frac{W'_{eff} L_{eff}}{2 l_{tw}}\right) + 2\exp\left(-D_{VT1w} \frac{W'_{eff} L_{eff}}{1 l_{tw}}\right) \right)(V_{bi} - \Phi_s)$$

$$- D_{VT0} \left( \exp\left(-D_{VT1} \frac{L_{eff}}{2 l_t}\right) + 2\exp\left(-D_{VT1} \frac{L_{eff}}{1 l_t}\right) \right)(V_{bi} - \Phi_s)$$

P1
$0.415 = (-4.4E-3) + 0.385 \times \sqrt{0.865 - (-2.193E-5)} - (-0.027) \times (-2.193E-5)$
$+ 0.385 \times \left( \sqrt{1 + \frac{1.459E-7}{3.724E-7}} - 1 \right) \times \sqrt{0.865} + ((-0.148) + 0.331 \times (-2.193E-5)) \times \frac{4.19E-9}{1.906E-7 + 0} \times 0.865$
$- 0 \times \left( \exp\left(-2.807E8 \times \frac{1.906E-7 \times 3.724E-7}{2 \times 2.896E-8}\right) + 2 \times \exp\left(-2.807E6 \times \frac{1.906E-7 \times 3.724E-7}{2.896E-8}\right) \right) \times (1.019 - 0.865)$
$- 14.548 \times \left( \exp\left(-2.069 \times \frac{3.724E-7}{2 \times 2.696E-8}\right) + 2 \times \exp\left(-2.069 \times \frac{3.724E-7}{2.996E-8}\right) \right)(1.019 - 0.865)$

P1
$0.415 = (-4.4E-3) + 0.358 - 5.857E-7$
$+ 0.064 + (-2.807E-3)$
$- 0 \times (0.032 + 2.057E-3) \times 0.154$
$- 14.548 \times (1.889E-6 + 5.571E-12) \times 0.154$
$- (0.019 + 7.368E-4) \times 6.344E-3$

Optimization
[ 3.5383E-1 ] [ 3.8025E-2 ]

P2
$0.415 = (-4.4E-3) + 0.385 \times \sqrt{0.865 - (-9.75E-5)} - (-0.027) \times (-9.74E-5)$    602
$+ 0.385 \times \left( \sqrt{1 + \frac{1.459E-7}{3.724E-7}} - 1 \right) \times \sqrt{0.685} + ((-0.148) + 0.331 \times (-9.74E-5)) \times \frac{4.19E-9}{1.908E-7 + 0} \times 0.865$
$- 0 \times \left( \exp\left(-2.807E6 \times \frac{1.906E-7 \times 3.724E-7}{2 \times 2.896E-8}\right) + 2 \times \exp\left(-2.807E6 \times \frac{1.906E-7 \times 3.724E-7}{2.896E-8}\right) \right) \times (1.019 - 0.865)$
$- 14.548 \times \left( \exp\left(-2.069 \times \frac{3.724E-7}{2 \times 2.696E-8}\right) + 2 \times \exp\left(-2.069 \times \frac{3.724E-7}{2.996E-8}\right) \right)(1.019 - 0.865)$

P2
$0.415 = (-4.4E-3) + 0.358 - 2.802E-6$
$+ 0.064 + (-2.807E-3)$
$- 0 \times (0.032 + 2.050E-3) \times 0.154$
$- 14.548 \times (1.67E-6 + 5.577E-12) \times 0.154$
$(0.019 + 7.368E-4) \times 6.335E-3$

FIG. 9

GRAPHICAL USER INTERFACE FOR VIEWING INTERMEDIATE CALCULATIONS FROM A DEVICE MODEL

RELATED APPLICATIONS

The present application claims priority to U.S. Provisional Patent Application No. 60/938,767, filed May 18, 2007, and is a continuation in part of U.S. patent application Ser. No. 12/123,407, filed May 19, 2008, which is abandoned, both entitled "Method and System for Debugging a Circuit Design". The disclosures of both applications are incorporated herein by reference.

BACKGROUND

In order to predict the behavior of a design for an integrated circuit, designers and manufacturers (e.g., foundries) often use analog simulation programs such as SPICE. Typically, such a simulation program takes three inputs: (1) a netlist or other description of the integrated circuit's elements (e.g., transistors, resistors, capacitors, inductors, etc.) and their connections; (2) a mathematical device model which describes the integrated circuit using equations; and (3) a description of an input voltage, e.g., from an input waveform.

Some device models implemented in simulation programs have achieved wide acceptance in an industry and have become industry standards. Examples of such device models include Gummel-Poon (GP), BSIM3v3, BSIM4, and PSP. Presently, many of these industry-standard device models are established and maintained by the Compact Model Council. In order to achieve a good fit between the measured data and the simulated data for a device model, modeling engineers set the values of the parameters (e.g., exogenous variables) in the model's equations based on empirical measurements, rather than using default values or ranges associated with the model. These parameters tend to be quite numerous, when fully decomposed. The process of going from empirical measurements to parameter values is called "parameter extraction" and is well-documented. For example, see Franz Sischka, "Modeling a Diode" (Agilent Technologies; Apr. 17, 2001).

Companies such as Agilent and Cadence have developed software/hardware tools to assist with parameter extraction and simulation. A shortcoming of these tools is that they show the output of a simulation (e.g., calculated voltages and currents such as threshold voltage or mobility) in an aggregated form which is not useful for modeling engineers who are attempting to debug or optimize a circuit level design by adjusting the parameter values in a model's equations. Consequently, there is a need for tool that shows the parameter values in intermediate calculations leading up to a simulation output and the results of changing those parameter values.

SUMMARY

In an example embodiment, the system receives inputs from a user including: (1) a netlist that describes the circuit elements and connections of an integrated circuit; (2) a mathematical device model that corresponds to the integrated circuit and that includes an equation with a number of parameters and decision variables grouped into terms; and (3) a description of an input voltage. Based on these inputs, the system calculates an output such as a voltage (e.g., threshold voltage) or current resulting from application of the input voltage to the integrated circuit. Then the system displays a GUI that includes a pair of views, one of which shows each of the terms of the equation after a value has been assigned to each parameter and to each decision variable and one of which shows each of the terms of the equation after reduction of the values assigned to each parameter and each variable.

In an example embodiment, the system might also display a view reproducing the equation and/or an additional pair of views corresponding to a user's change in a decision variable. Additionally, the system might receive a user's change to the value of a parameter and promptly update (e.g., in real time) the views showing the equation's terms before and after reduction.

In an example embodiment, the mathematical device model might be a standard device model (e.g., BSIM3v3) established or maintained by the Compact Model Council. Also, the calculation of the output voltage or current (e.g., the dependent variable) might be performed by a simulation engine based on SPICE (e.g., a modified SPICE 3F5 engine).

Other aspects and advantages of the invention will become apparent from the following detailed description, taken in conjunction with the accompanying drawings, which illustrates by way of example the principles of the invention.

DETAILED DESCRIPTION

In the following description, numerous specific details are set forth in order to provide a thorough understanding of the exemplary embodiments. However, it will be apparent to one skilled in the art that the example embodiments may be practiced without some of these specific details. In other instances, process operations and implementation details have not been described in detail, if already well known.

Figure 1:
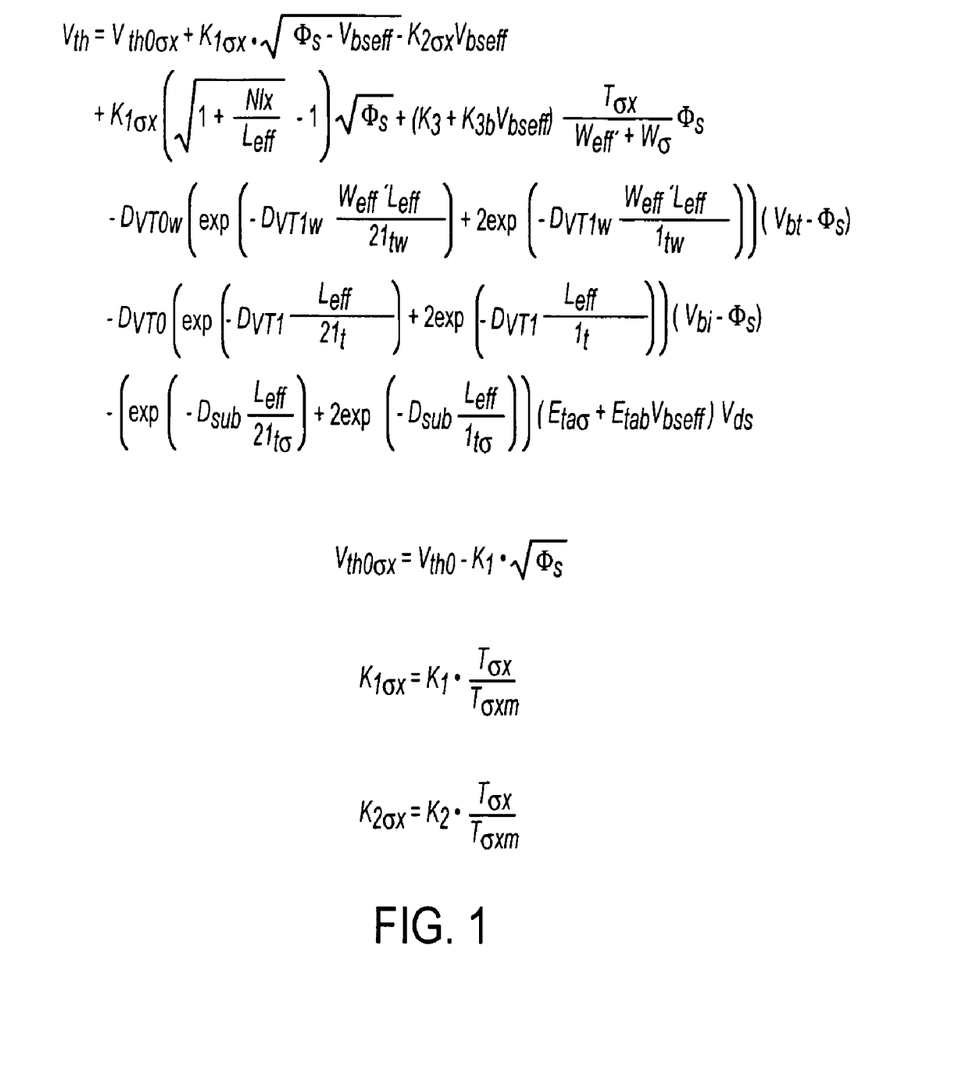
FIG. 1 includes an equation for threshold voltage from the BSIM3v3 device model, which might be used in an example embodiment.

FIG. 1 includes an equation for threshold voltage from the BSIM3v3 MOFSET current-voltage (I-V) model, which might be used in an example embodiment. It will be appreciated that BSIM (Berkeley Short-channel IGFET Model) refers to a family of MOSFET transistor models for integrated circuit design. Accurate modeling of threshold voltage ($V_{th}$) is one of the most important requirements for precise description of device electrical characteristics. In addition, $V_{th}$ serves as a useful reference point for the evaluation of device operation regimes. It will be appreciated that other equations (e.g., mobility) and other device models (both industry standard models and/or models resulting from empirical measurements) might be used in place of $V_{th}$ and BSIM3v3; they are used solely for purposes of illustration.

The equation for $V_{th}$ shown in FIG. 1 is from Appendix A to the *BSIM3v3.3 MOSFET Model Users' Manual* (Department of Electrical Engineering and Computer Sciences University of California, Berkeley; 2005). As shown by the equation for the parameter $V_{th0x}$ (shown below the equation for $V_{th}$), many, if not most, of the parameters in the equation for $V_{th}$ are defined by other parameters in other equations. Most of those other equations are not shown. It will be appreciated that the task of debugging or optimizing the terms in such equations is nontrivial and can only be readily performed with human-centered software; the task does not lend itself to full automation.

Figure 2A:
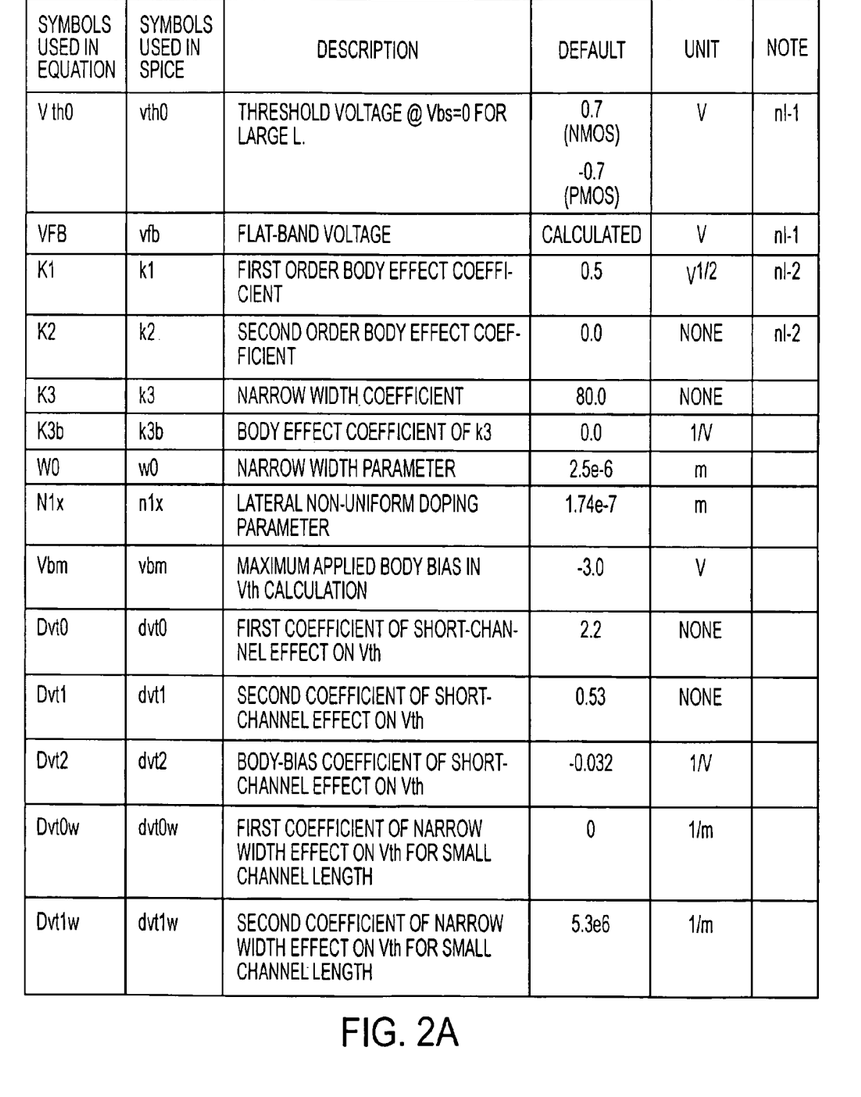
FIGS. 2A, 2B, and 2C are tables showing a partial list of parameters from the BSIM3v3 device model, which might be used in an example embodiment.
Figure 2B:
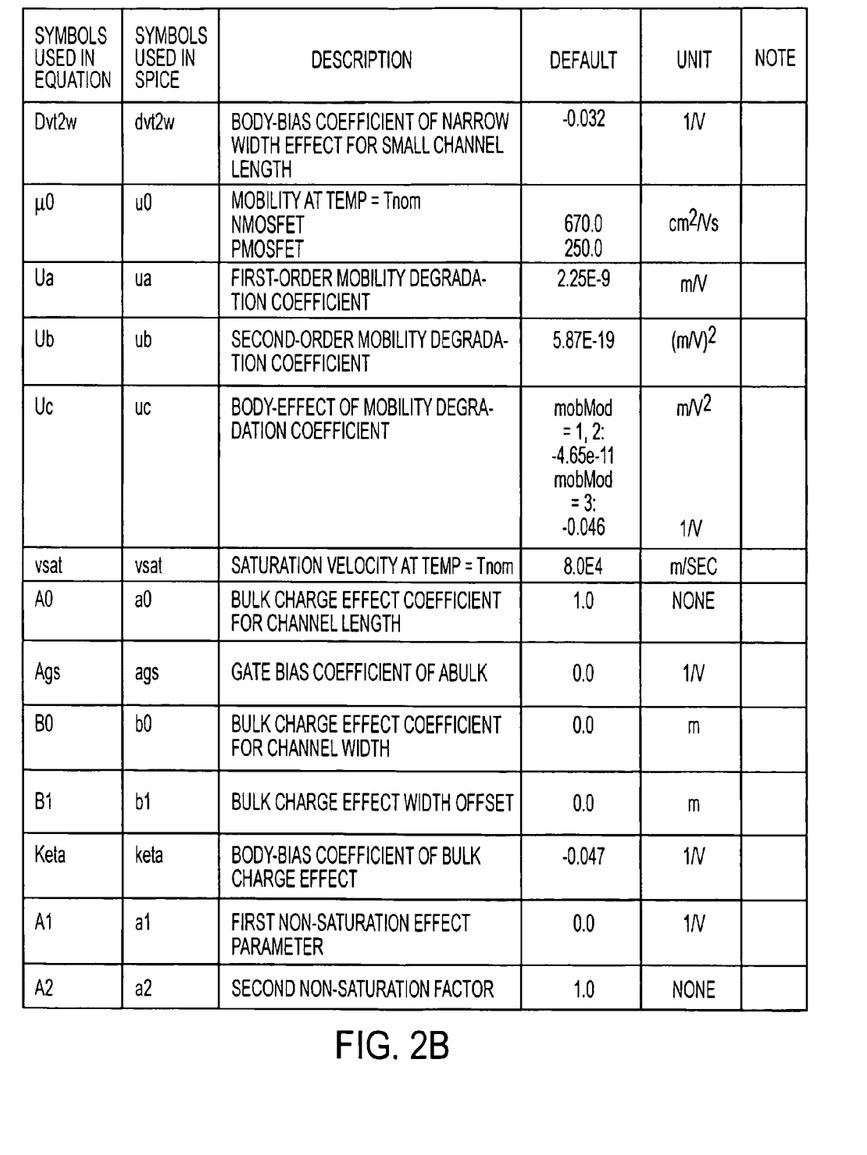
Figure 2C:
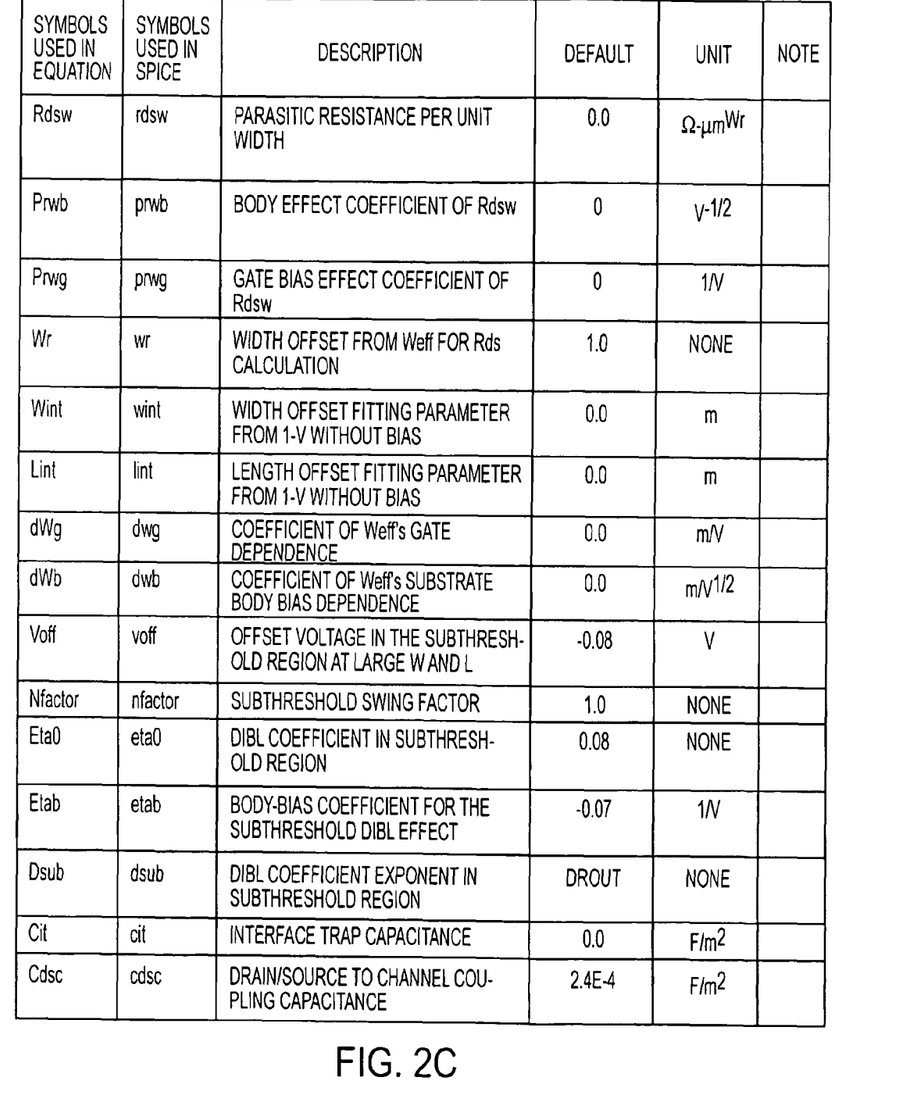

FIGS. 2A, 2B, and 2C are tables showing a partial list of the DC parameters from the BSIM3v3 MOSFET model, which might be used in an example embodiment. These tables are from Appendix B to the *BSIM3v3.3 MOSFET Model Users' Manual*. The entries in the second column in each table show the SPICE symbols corresponding to the equation symbols shown in the entries in the first column. The first parameter described in the table in FIG. 2A is $V_{th0}$ which is a parameter in the equation for $V_{th0x}$, shown in FIG. 1. One of the parameters described in the table in FIG. 2A is Nlx or nlx (lateral non-uniform doping parameter) which is a parameter in the equation for $V_{th}$, shown in FIG. 1. As noted in the fourth column of that table, the default value for Nlx is 1.74e-7.

Figure 3:
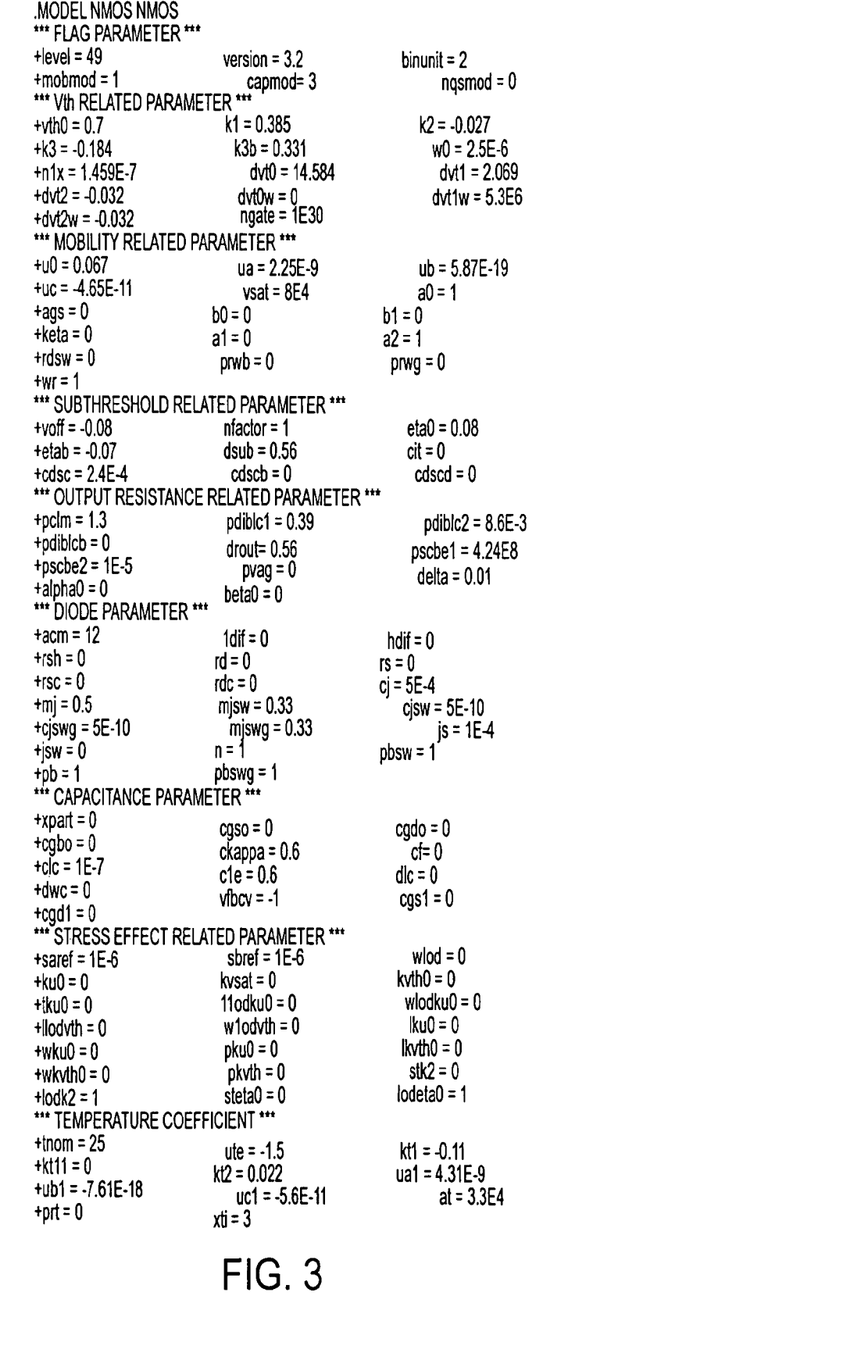
FIG. 3 is a SPICE .model file, which might be used in an example embodiment.

FIG. 3 is a SPICE .model file, which might be used in an example embodiment. The .model file contains a list of parameter values associated with SPICE symbols. It will be appreciated that many of the SPICE symbols shown in FIG. 3 are also shown in the tables in FIGS. 2A, 2B, and 2C. It will also be appreciated that many of the values of the parameters shown in the .model file differ from the default values and ranges shown in the tables in FIGS. 2A, 2B, and 2C. For example, as noted earlier, the default value for nlx (or Nlx) is 1.74e-7 in the table shown in FIG. 2A. However, in the .model file shown in FIG. 3, the value for nlx is 1.459e-7. In an example embodiment, the .model file for a device might be generated through parameter extractions from empirical measurements, using a software/hardware tool as described earlier.

Figure 4:
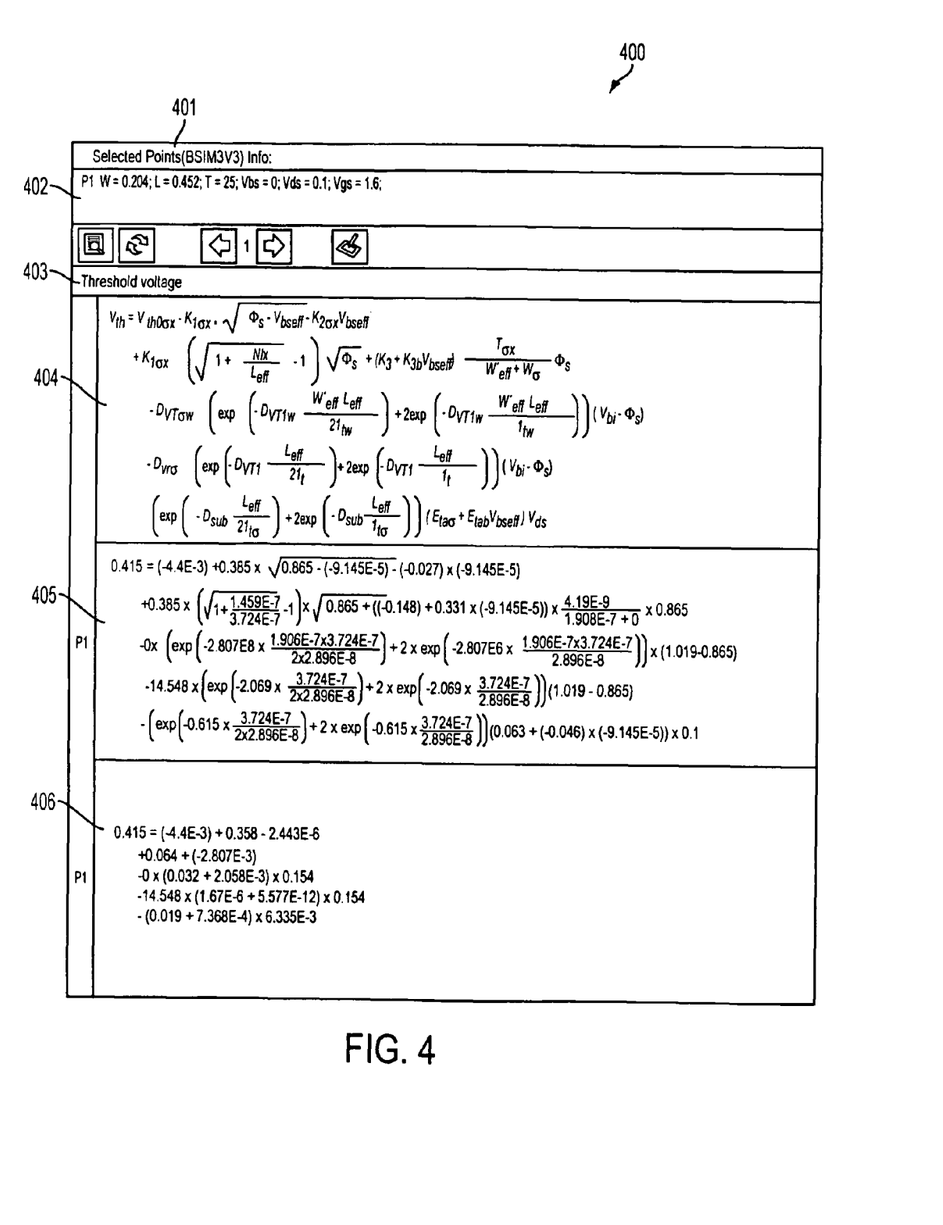
FIG. 4 is a GUI displaying views of a device-model equation based on assigned parameter values and a single set of decision variables, in accordance with an example embodiment.

FIG. 4 is a GUI displaying views of a device-model equation based on assigned parameter values and a single set of decision-variable values, in accordance with an example embodiment. In FIG. 4, GUI 400 includes four views (or windows) 402, 404, 405, and 406. As indicated in title bar 401, the views relate to a particular device model, namely, "BSIM3V3". Further, as indicated in title bar 403, the views relate to a particular equation from BSIM3V3, namely, "Threshold voltage". It will be recalled that the equation for the threshold voltage from BSIM3v3 is shown in FIG. 1. That equation is reproduced in view 404. View 402 shows the set of decision variables which are input to the equation and which might relate to a point on an extraction curve, in an example embodiment, as suggested by the title bar 401 ("Selected Points"). It will be appreciated that these inputs include the physical channel width W, the physical channel length L, and the temperature T, as well as the bulk-source voltage (Vbs), the drain-source voltage (Vds), and the gate-source voltage (Vgs). In an example embodiment, one or more of these voltages might result from a description of an input voltage, e.g., from an input waveform. View 405 shows the terms of the equation for threshold voltage after the assignment of values for parameters (e.g., $V_{th0}$) and decision variables (e.g., Vds). View 406 shows the same terms following reduction of the assigned values. It will be appreciated that views 405 and 406 allow a user to quickly visually determine which parameters, decision variables, and terms in the equation are most quantitatively significant, in terms of absolute and relative value.

Figure 5:
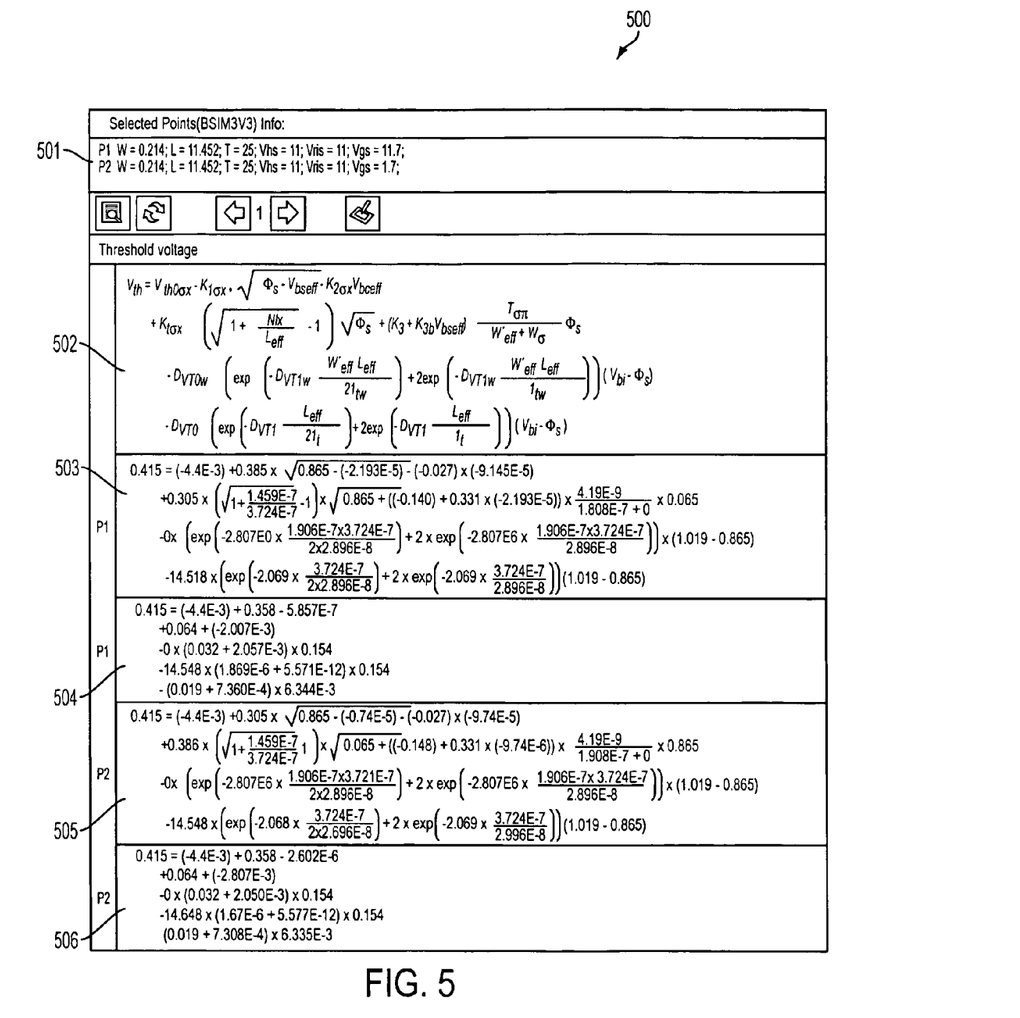
FIG. 5 is a GUI displaying views of a device-model equation based on assigned parameter values and two sets of decision variables, in accordance with an example embodiment.

FIG. 5 is a GUI displaying views of a device-model equation based on assigned parameter values and two sets of decision variables, in accordance with an example embodiment. In FIG. 5, GUI 500 includes six views (or windows). As in FIG. 4, the views relate to the threshold-voltage equation for the BSIM3v3 device model. However, as shown in view 501, two sets of decision variables, P1 and P2, have been input into the equation. The two sets of decision variables differ only as to the value for Vgs. For P1, Vgs is 0.7; for P2, Vgs is 1.7. The Vgs variable affects the calculation of the parameter $V_{bseff}$ shown in the second and third terms of the equation. Consequently, in view 503, which pertains to P1, the value of $V_{bseff}$ becomes -2.193E-5 after assignment of all parameters and decision variables. In view 505, which pertains to P2, the value of $V_{bseff}$ becomes -9.74E-5 after assignment of all parameters and decision variables. Views 504 and 506 show the equations in 503 and 505, respectively, after reduction of the assigned values. It will be appreciated that views 503 and 505 allow a user to quickly visually determine which parameters and terms in the equation are implicated by a change in Vgs.

Figure 6A:
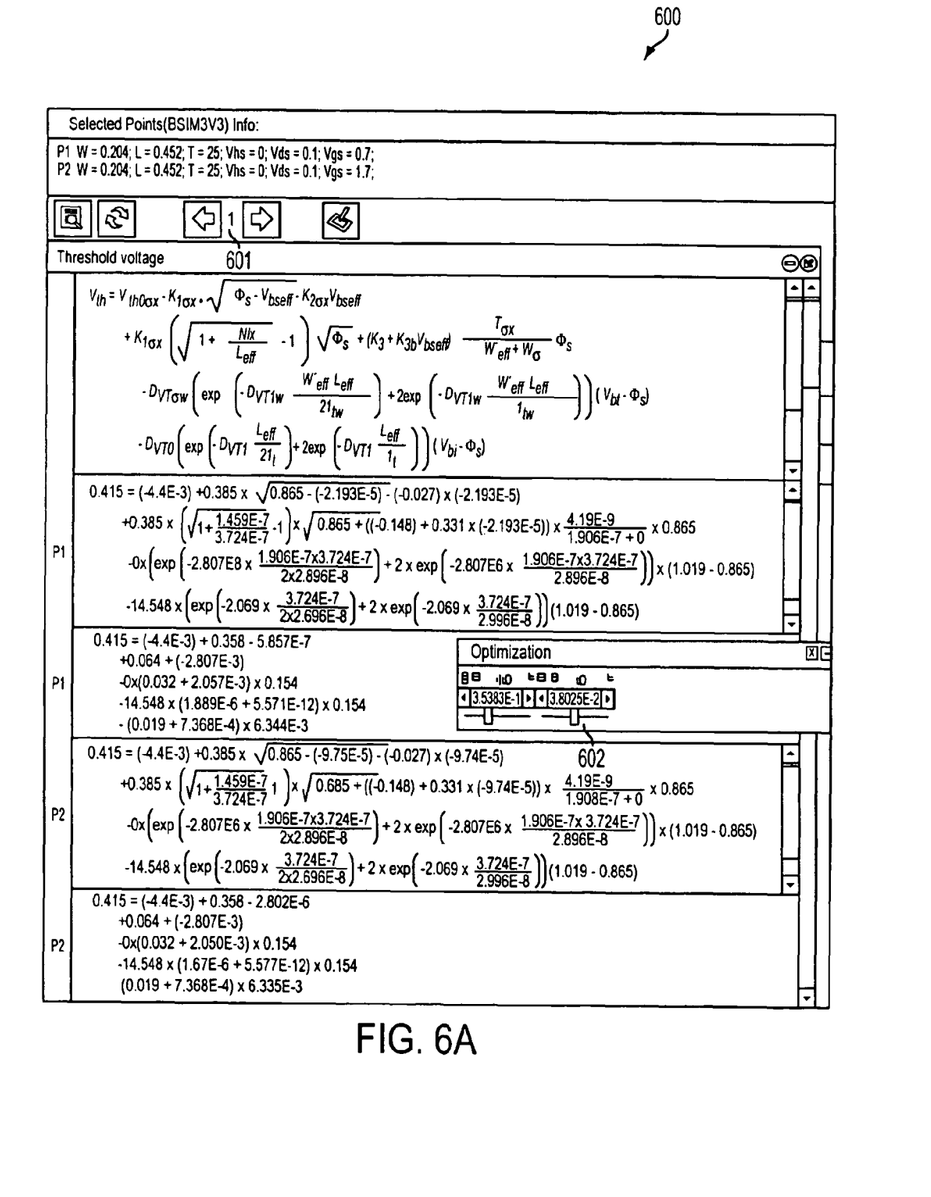
FIG. 6A is a GUI displaying an optimization dialog that allows the user to enter new values for parameters, in accordance with an example embodiment.

FIG. 6A is a GUI displaying an optimization dialog that allows the user to enter new values for parameters, in accordance with an example embodiment. The GUI 600 in FIG. 6A includes the GUI 500 shown in FIG. 5, along with an optimization dialog 602 that allows a user to change the value of a parameter such as "vth0" or "u0", using a slider. GUI 600 includes a document identifier 601 which identifies the GUI 600 as the first page ("1") in a multipage document interface. The parameter u0, whose value is 3.8025E-2, also affects the calculation of the parameter $V_{bseff}$ shown in the second and third terms of the threshold-voltage equation.

Figure 6B:
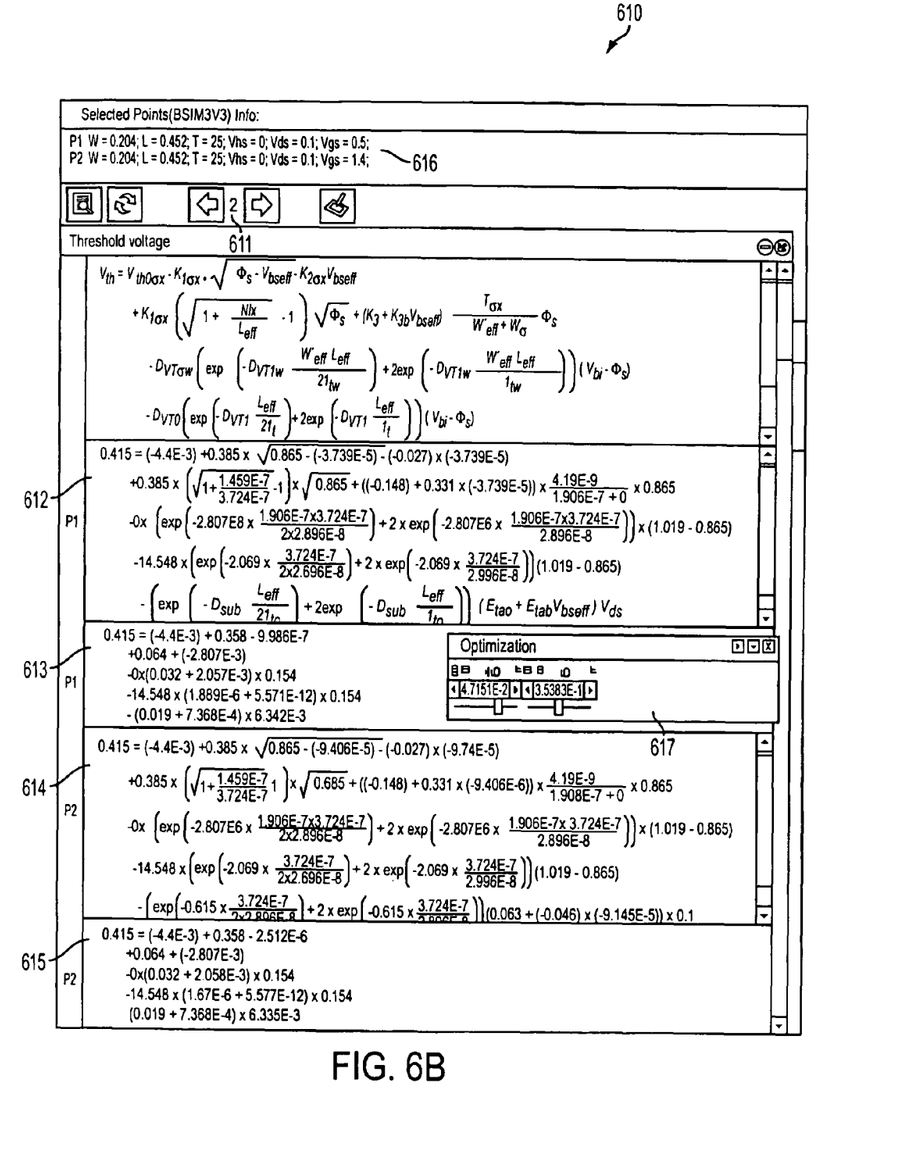
FIG. 6B is a GUI showing the view changes resulting from the entry of a new parameter value in an optimization dialog, in accordance with an example embodiment.

FIG. 6B is a GUI showing the view changes resulting from the entry of a new parameter value in an optimization dialog, in accordance with an example embodiment. The optimization dialog 617 in GUI 610 displays a value of 4.7151E-2 for u0, reflecting an increase made by a user (e.g., with the slider) from the previous value of 3.8025E-2. This increase results in changes to views (or windows) 612, 613, 614, 615, and 616. In view 612, which pertains to P1, the value of $V_{bseff}$ goes from -2.193E-5 to -3.739E-5, which in turn affects the related calculations in view 613. In view 614, which pertains to P2, the value of $V_{bseff}$ goes from -9.74E-5 to -9.406E-5, which in turn affects the related calculations in view 615. In view 616, the value of Vgs for P1 goes from 0.7 to 0.8 and the value of Vgs for P2 goes from 1.7 to 1.4. Here it will be appreciated that the value of the threshold voltage ($V_{th}$) did not change from 0.415. GUI 610 also includes a document identifier 611 which identifies the GUI 610 as the second page ("2") in a multipage document interface.

In an example embodiment, the optimization dialog shown in FIGS. 6A and 6B promptly (e.g., in real time) updates the affected GUI views upon entry of a new parameter value. It will be appreciated that such updating allows a user to rapidly determine the best parameter values for a particular circuit level design, when performing a debugging or optimization task.

Figure 7:
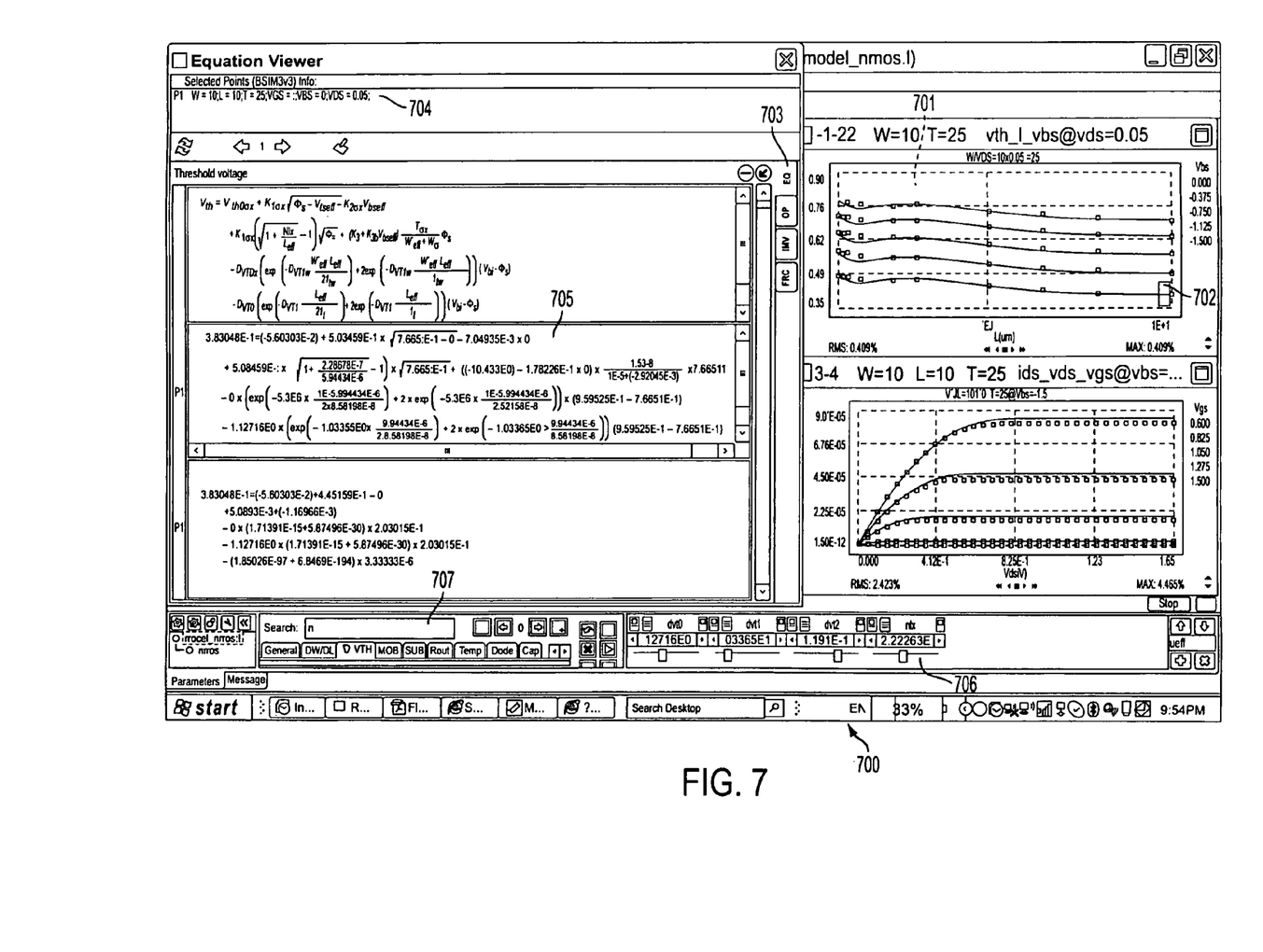
FIG. 7 is a GUI displaying views of a device-model equation and the extraction-curve point that determines the parameters for the equation, in accordance with an example embodiment.

FIG. 7 is a GUI displaying views of a device-model equation and the extraction curve point that determines the parameters for the equation, in accordance with an example embodiment. In FIG. 7, GUI 700 includes views (or windows) 701, 704, 705, 706, and 707. View 701 shows a set of extraction curves plotting threshold voltage ($V_{th}$) against L and Vbs, when W equals 10, T equals 25, and Vds equals 0.05. Point 702 is a point on the extraction curve for Vbs equal to 0.000, where Vgs equals 1 and $V_{th}$ equals 3.83048E-1. It will be appreciated that P1 in view 704 corresponds to point 702, e.g., P1 in view 704 results from the selection by a user of point 702 in view 701. View 705 is associated with GUI tab 703, labeled "EQ"; view 705 is the same GUI depicted in FIGS. 4 and 5 (although the values shown in the GUI are not identical). View 706 is an optimization dialog similar to the optimization dialogs depicted in FIGS. 6A and 6B; however, the user can use this optimization dialog to see changes in the extraction curves shown in view 701, as well as in the values for equation parameters and terms shown in view 705. View 707 allows a user to enter a value for a parameter, after searching for the parameter by SPICE symbol. View 707 might include parameter values which have not been entered by a user but rather result from fitting an extraction curve to a set of empirical measurements, in an example embodiment. As noted earlier, these parameter values might also be input using a SPICE .model file similar to the one depicted in FIG. 3.

Figure 8:
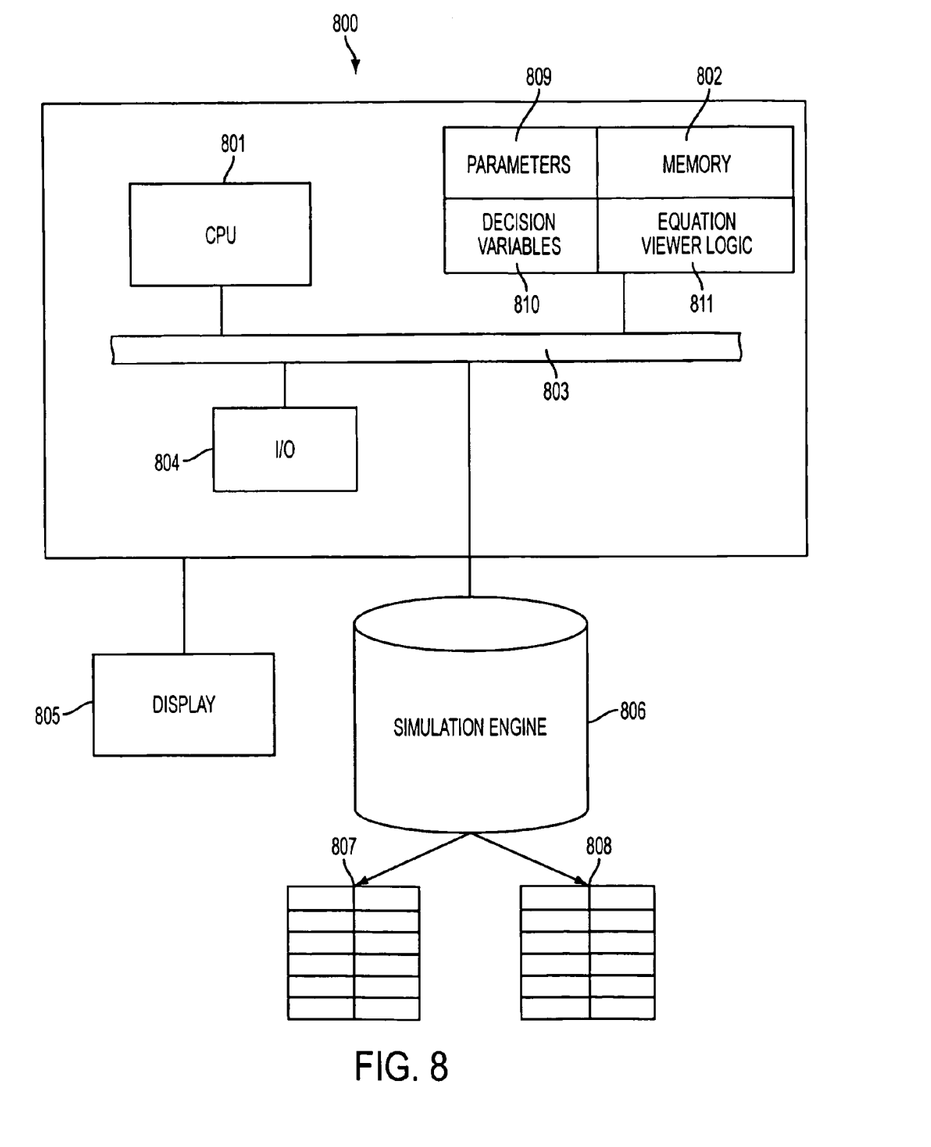
FIG. 8 is a schematic diagram showing an architecture for a hardware and software system, in accordance with an example embodiment.

FIG. 8 is a schematic diagram showing an architecture for a hardware and software system, in accordance with an example embodiment. System 800 includes CPU 801, memory 802, bus 803, and input/output module 804. CPU 801, memory 802, and input/output module 804 are configured to communicate with each other over bus 803. Memory 802 includes a number of components: parameters 809, decision variables 810, and equation viewer logic 811. Parameters 809 may include a list of parameters, similar to the one depicted in FIG. 3. Decision variables 810 may store data regarding channel length, channel width, temperature, base-source voltage, gate-source voltage, drain-source voltage, etc. The equation viewer logic 811 generates the GUIs described earlier for viewing by a user on display 805. In addition, a simulation engine 806 (e.g., a modified SPICE 3F5) provides logic to determine the equation outputs (e.g., threshold voltage) and intermediate calculations for the GUIs. In an example embodiment, data tables 807 and 808 are stored within a database housing simulation engine 806. The data tables 807 and 808 might include a persistently stored list of parameters and decision variables, respectively.

Figure 9:
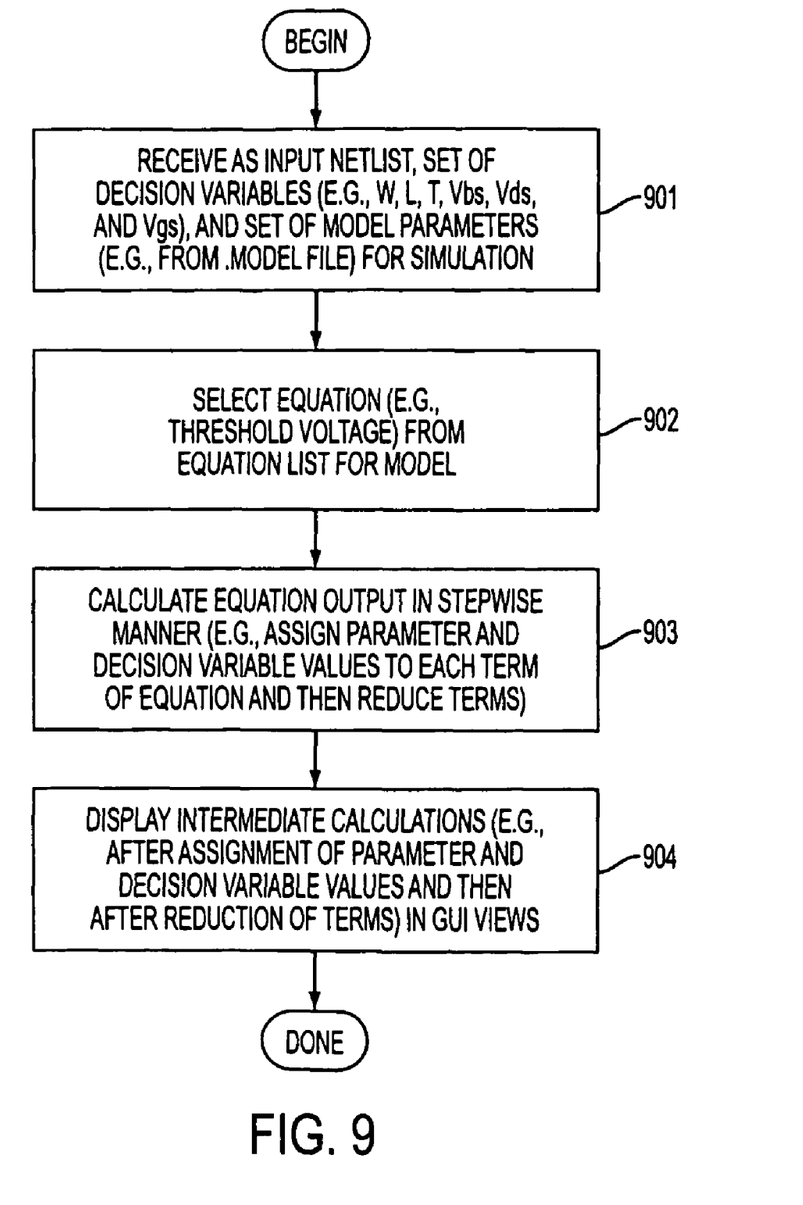
FIG. 9 is a high-level flowchart diagram showing a process for generating and displaying GUI views of a device-model equation, in accordance with an example embodiment.

FIG. 9 is a high-level flowchart diagram showing a process for generating and displaying GUI views of a device-model equation, in accordance with an example embodiment. In the first operation 901 of the process, the system receives as simulation inputs from a user a netlist, a set of decision variables (e.g., W, L, T, Vbs, Vds, and Vgs), and a set of parameters for a device model (e.g., BSIM3v3). In operation 902, the user selects an equation from the equation list for the model, such as threshold voltage or mobility from the I-V model for BSIM3v3. In operation 903, the system calculates the equation output (or dependent variable) in a stepwise manner (e.g., by assigning parameter and decision-variable values to each term in the equation and then by reducing the terms), so that intermediate calculations are preserved. In operation 904, the system displays the intermediate calculations (e.g., after assignment of parameter and decision-variable values and then after reduction of terms) in GUI views which allow the user to change a parameter value and promptly (e.g., in real time) see the results of the change.

In summary, the above described embodiments provide an efficient system for debugging a circuit design. Through the use of an equation viewer that displays intermediate calculations, a user is able to modify the parameters and decision variables of the design in order to determine which parameters and/or decision variables have a large impact on the output of the design. One might think of the equation viewer as a tool for "white-boxing" or "data disaggregation".

Any of the operations described herein that form part of the invention are useful machine operations. The invention also relates to a device or an apparatus for performing these operations. The apparatus can be specially constructed for the required purpose, or the apparatus can be a general-purpose computer selectively activated, implemented, or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. For example, the equation viewer might show an equation from BSIM4 or PSP, instead of BSIM3v3, or even an equation from a device model that is not an industry standard. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims or implicitly required by the specification.

What is claimed is:

1. Logic encoded in one or more non transitory computer-readable media and when executed operable to:
    receive as inputs a netlist, a mathematical device model, and a description of an input voltage, wherein the netlist describes circuit elements and connections of an integrated circuit and wherein the mathematical device model corresponds to the integrated circuit and includes an equation with a plurality of parameters and decision variables grouped into a plurality of terms within the equation;
    calculate one or more outputs based on the inputs, wherein the one or more outputs include one of a voltage or a current resulting from application of the input voltage to the integrated circuit; and
    display a graphical user interface that includes a pair of views, a first view illustrating numerical values for each of the terms of the equation after a numerical value has been assigned to each parameter and to each decision variable and a second view illustrating numerical values for each of the terms of the equation after reduction of the values assigned to each parameter of the plurality of parameters, the second view further illustrating each decision variable as illustrated in the first view.

2. The encoded logic of claim 1, wherein the graphical user interface includes a view that displays the equation.

3. The encoded logic of claim 1, wherein the mathematical device model is an industry standard device model.

4. The encoded logic of claim 1, wherein the calculation of an output is performed by a simulation engine based on SPICE.

5. The encoded logic of claim 1, wherein the description of the input voltage is an input waveform.

6. The encoded logic of claim 1, wherein the graphical user interface includes one or more additional pairs of views and wherein each of the additional pairs of views corresponds to a change in the value of a decision variable.

7. The encoded logic of claim 1, further comprising encoded logic to receive a change in the value of a parameter and update in real time the parameters and terms shown in the pair of views to reflect the change in the value of the parameter.

8. The encoded logic of claim 1, wherein the encoded logic is a module in a software/hardware tool that generates the value for at least one of the parameters by fitting a curve to a set of empirical measurements.

9. The encoded logic of claim 8, wherein the software/hardware tool includes a module that displays a graphical user interface which includes a view of the curve fit to the set of empirical measurements.

10. A method, comprising:
receiving as inputs to a software module a netlist, a mathematical device model, and a description of an input voltage, wherein the netlist describes circuit elements and connections of an integrated circuit and wherein the mathematical device model corresponds to the integrated circuit and includes an equation with a plurality of parameters and decision variables grouped into a plurality of terms within the equation;
calculating, in the software module, one or more outputs based on the inputs, wherein the one or more outputs include one of a voltage or a current resulting from application of the input voltage to the integrated circuit; and
displaying a graphical user interface that includes a pair of views, a first view illustrating numerical values for each of the terms of the equation after a numerical value has been assigned to each parameter and to each decision variable and a second view illustrating numerical values for each of the terms of the equation after reduction of the values assigned to each parameter of the plurality of parameters, the second view further illustrating each decision variable as illustrated in the first view.

11. The method of claim 10, wherein the graphical user interface includes a view that displays the equation.

12. The method of claim 10, wherein the mathematical device model is an industry standard device model.

13. The method of claim 10, wherein the calculation of an output is performed by a simulation engine based on SPICE.

14. The method of claim 10, wherein description of the input voltage is an input waveform.

15. The method of claim 10, wherein the graphical user interface includes one or more additional pairs of views and wherein each of the additional pairs of views corresponds to a change in the value of a decision variable.

16. The method of claim 10, further comprising receiving a change in the value of a parameter and updating in real time the parameters and terms shown in the pair of views to reflect the change in the value of the parameter.

17. The method of claim 10, wherein the software module is a module in a software/hardware tool that generates the value for at least one of the parameters by fitting a curve to a set of empirical measurements.

18. The method of claim 10, wherein the software/hardware tool includes a module that displays a graphical user interface which includes a view of the curve fit to the set of empirical measurements.

19. The method of claim 18, further comprising an operation in which at least one of the inputs to the calculating operation results from selecting a point on the curve.

20. Logic encoded in one or more non transitory computer-readable media and when executed operable to:
receive as inputs a netlist, a mathematical device model, and a description of an input voltage, wherein the netlist describes circuit elements and connections of an integrated circuit and wherein the mathematical device model corresponds to the integrated circuit and includes an equation with a plurality of parameters and decision variables grouped into a plurality of terms within the equation;
calculate one or more outputs based on the inputs, wherein the one or more outputs include one of a voltage or a current resulting from application of the input voltage to the integrated circuit; and
display a graphical user interface that includes a view showing a disaggregation of an output, wherein the disaggregation is based on the terms, and wherein the disaggregation includes displaying a view illustrating numerical values for each of the terms of the equation after reduction of values assigned to each parameter of the plurality of parameters, the view further illustrating each decision variable.

* * * * *